United States Patent [19]

Takahashi

[11] Patent Number: 4,631,490
[45] Date of Patent: Dec. 23, 1986

[54] AUDIO OUTPUT AMPLIFYING DEVICE
[75] Inventor: Yoshiaki Takahashi, Saitama, Japan
[73] Assignee: Pioneer Electronic Corp., Tokyo, Japan
[21] Appl. No.: 683,447
[22] Filed: Dec. 19, 1984
[30] Foreign Application Priority Data Dec. 19, 1983 [JP] Japan .......................... 58-195771[U]

[51] Int. Cl.[4] ............................................. H03F 3/68
[52] U.S. Cl. ........................................ 330/51; 330/84; 330/124 R; 330/146; 330/295
[58] Field of Search .............. 330/51, 84, 124 R, 146, 330/262, 271, 295

[56] References Cited
U.S. PATENT DOCUMENTS 3,939,435 2/1976 Suzuki ................................. 330/51
4,494,077 1/1985 Fukaya et al. ............... 330/124 R X Primary Examiner—James B. Mullins
Attorney, Agent, or Firm—Sughrue, Mion, Zinn Macpeak & Seas

[57] ABSTRACT

An audio output amplifying device which is adapted for use in a plurality of audio output amplifying circuits. An audio signal to be amplified is supplied to a positive phase input of a first differential amplifier. The positive phase input of a second differential amplifier is selectively coupled either to a source of a reference voltage (ground) or the source of the audio signal. A feedback circuit is connected between the output of the first differential amplifier and the negative phase inputs of both the first and second differential amplifiers. A switch is provided to selectively couple the output of the first differential amplifier to ground in one position and to allow amplification by both differential amplifiers in a second position.

6 Claims, 1 Drawing Figure

AUDIO OUTPUT AMPLIFYING DEVICE

BACKGROUND OF THE INVENTION

The present invention relates to an audio output amplifying device.

A balanced transformerless amplifier (hereinafter referred to as a BTL amplifier when applicable) is well known in the art as an audio output amplifying device. In the BTL amplifier, two SEPP (Single-Ended Push-Pull) amplifiers are connected in parallel to a power source and in series with a load so that a high output can be obtained with a relatively low supply voltage. It is generally not economical to use a BTL amplifier, however, for a load which can be sufficiently driven with a small amount of electric power. Sometimes it is preferable to allow two SEPP amplifiers forming a BTL amplifier to drive two loads because the resulting audio device can be reduced in circuit complexity and size.

It goes without saying that, in manufacturing a plurality of audio amplifying devices, including such an audio output amplifying device, which are different in circuitry, economical use of a single audio output amplifying device for a plurality of such audio devices is preferable.

SUMMARY OF THE INVENTION

Accordingly, an object of the invention is to provide an audio output amplifying device which can be used in manufacture economically for a plurality of audio amplifying devices of different circuitry.

An audio output amplifying device according to the invention comprises first differential amplifier means to which an audio output is supplied as a positive phase input, signal selecting means for selectively outputting the audio output or a predetermined voltage, second differential amplifier means to which an output of the signal selecting means is applied as a positive phase input, feedback means having an output terminal connected to the negative phase input terminals of the first and second differential amplifier means so that an output of the first differential amplifier means is fed back to the negative phase input terminals of the first and second differential amplifier means, and switching means connected between an input terminal of the feedback means and a predetermined reference potential point, the switching means being turned on when an instruction is issued to cause the signal selecting means to selectively output the audio output.

BRIEF DESCRIPTION OF THE DRAWING

In the accompanying drawing, the single FIGURE is a circuit diagram showing a preferred embodiment of an audio output amplifying device of the invention.

DESCRIPTION OF THE PREFERRED EMBODIMENT

Figure 1:
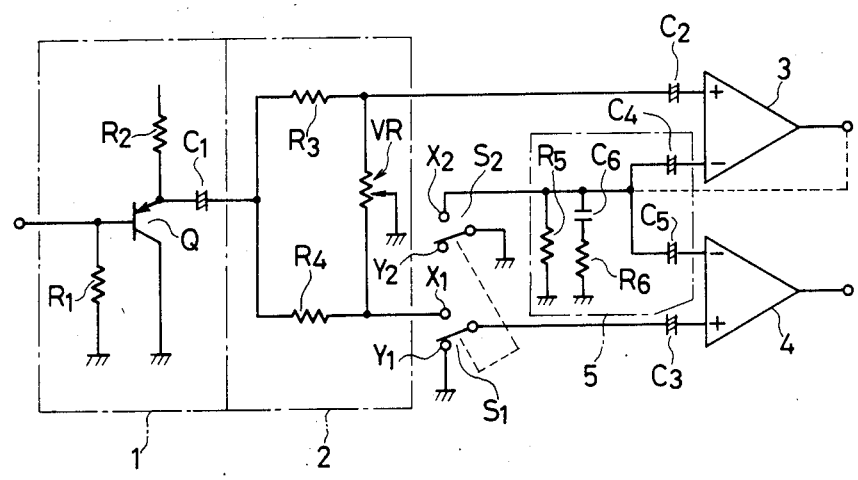

The invention will now be described with reference to a preferred embodiment shown in the accompanying drawing.

As shown in the single FIGURE in the accompanying drawing, an audio output of a tuner or the like is applied through a buffer amplifier 1 composed of a transistor Q, resistors $R_1$ and $R_2$, and a capacitor $C_1$ to a fader circuit 2. In the fader circuit 2, the audio output is applied to the common terminal of resistors $R_3$ and $R_4$. A variable resistor VR is connected between the other terminals of the resistors $R_3$ and $R_4$. The sliding contact of the variable resistor VR is grounded. The signal provided at the other terminal of the resistor $R_3$ is supplied through a capacitor $C_2$ to the positive phase input terminal (+) of a differential amplifier 3, while the signal provided at the other terminal of the resistor $R_4$ is supplied to a stationary contact $X_1$ of a signal selecting device, namely, a changeover switch $S_1$. A stationary contact $Y_1$ of the changeover switch $S_1$ is grounded. The signal provided at the armature of the changeover switch $S_1$ is supplied through a capacitor $C_3$ to the positive phase input terminal (+) of a differential amplifier 4. A series circuit of the capacitors $C_4$ and $C_5$ is connected between the negative phase terminals (−) of the differential amplifiers 3 and 4. The connecting point of the capacitors $C_4$ and $C_5$ is grounded through a parallel circuit composed of a resistor $R_5$ and a series circuit of a capacitor $C_6$ and a resistor $R_6$. The capacitor $C_4$, $C_5$ and $C_6$ and the resistors $R_5$ and $R_6$ form a feedback circuit 5. The input terminal of the feedback circuit 5 is the connecting point of the capacitors $C_4$ and $C_5$ and this point is further connected to a stationary contact $X_2$ of a changeover switch $S_2$, the armature of which is grounded. The armatures of the changeover switches $S_1$ and $S_2$ are operated simultaneously. Nothing is connected to a stationary contact $Y_2$ of the switch $S_2$.

In the circuit thus constructed, when the armatures of the changeover switches $S_1$ and $S_2$ are set to the stationary contacts $Y_1$ and $Y_2$, a BTL amplifier is formed. That is, when a load such as a loudspeaker is connected between the output terminals of the differential amplifiers 3 and 4 and the output of the differential amplifier 3 is applied to the stationary contact $X_2$ of the changeover switch $S_2$, the audio output supplied through the buffer amplifier 1 to the fader circuit 2, after being subjected to voltage division at a voltage division ratio determined by the resistor $R_3$ and the position of the sliding contact of the variable resistor VR, is supplied through the capacitor $C_2$ to the positive phase input terminal of the differential amplifier 3. Since the armature of the changeover switch $S_1$ in this case is grounded, no signal is supplied to the positive phase input terminal of the differential amplifier 4. On the other hand, the output of the differential amplifier 3 is supplied to the negative phase input terminal of the differential amplifier 4 through a connection shown in dotted lines and the feedback circuit 5. The dotted lines in the feedback loop indicate the ganged relationship between the establishment of this loop and the state of switches $S_1$, $S_2$. Accordingly, signals opposite in phase to each other are provided at the output terminals of the differential amplifiers 3 and 4 to drive the load connected between the output terminals of the differential amplifiers 3 and 4.

A two-channel amplifier is formed upon setting the armatures of the changeover switches $S_1$ and $S_2$ to the stationary contacts $X_1$ and $X_2$. That is, in this case, loads are connected respectively between the output terminal of the differential amplifier 3 and ground and between the output terminal of the differential amplifier 4 and ground. Since the stationary contact $X_2$ of the changeover switch $S_2$ is grounded, no signal is applied to the negative phase input terminals of the differential amplifiers 3 and 4. On the other hand, the audio output which is subjected to voltage division at a voltage division ratio determined by the resistor $R_3$ and the position of the sliding contact of the variable resistor VR is supplied to the positive phase input terminal of the differential amplifier 3, while the audio output which is subjected to voltage division at a voltage division ratio which is determined by the resistor R$_4$ and the position of the sliding contact of the variable resistor VR is applied to the positive phase input terminal of the differential amplifier 4. Accordingly, the signals provided at the output terminals of the differential amplifiers 3 and 4 are in phase with each other. These signals drive the two loads which are connected respectively between the output terminal of the differential amplifier 3 and ground and between the output terminal of the differential amplifier 4 and ground.

As is apparent from the above description, the audio output amplifying device of the invention is so designed that it forms a BTL amplifier to drive a single load in a first mode, thus allowing the latter to provide a high output, and it is operated to drive two loads in a second, multi-channel drive mode. Therefore, the amplifying device of the invention can be applied to a plurality of audio devices of different circuitry arrangements. Accordingly, in the manufacture of such audio devices, control and management of the components can be achieved with ease, which permits reduction of manufacturing costs.

I claim:
1. An audio output amplifying device, comprising:
   first differential amplifier means to which an audio output is supplied at a positive phase input;
   signal selecting means for selectively outputting one of said audio output and a predetermined fixed voltage;
   second differential amplifier means to which an output of said signal selecting means is applied at a positive phase input;
   feedback means having an input terminal selectively connected to or disconnected from an output of said first differential amplifier, and output terminals respectively connected to negative phase input terminals of said first and second differential amplifier means so that said output of said first differential amplifier means is selectively fed back to said negative phase input terminals of said first and second differential amplifier means via said feedback means; and
   switching means connected between said input terminal of said feedback means and a predetermined reference potential point, said switching means being turned on and said feedback means being disconnected from said first differential amplifier output, to disable said feedback means when an instruction is present to cause said signal selecting means to selectively output said audio output.
2. The audio output amplifying device of claim 1, wherein said signal selecting means comprises a first switch section, said first switch section having a terminal coupled to said positive phase input of said second differential amplifier, a first contact coupled to a ground point, and a second contact coupled to a source of said audio output, and wherein said switching means comprises a second switch section, said second switch section having a terminal coupled to said ground point, a first contact coupled to said input terminal of said feedback means and selectively coupled to said output of said first differential amplifier means, and a floating second contact, said first and second switch sections and said feedback means input terminal—first differential amplifier output connection being ganged to operate in unison.
3. The audio output amplifying device of claim 2, wherein said feedback means further comprises a first capacitor coupled between said input terminal of said feedback means and said negative phase input of said first differential amplifier means, and a second capacitor coupled between said input terminal of said feedback means and said negative phase input of said second differential amplifier means.
4. The audio output amplifying device of claim 3, wherein said feedback means further comprises a third capacitor and a first resistor in a series circuit between said input terminal of said feedback means and said ground point, and a second resistor coupled in parallel with said series circuit of said third capacitor and said first resistor.
5. The audio output amplifying device of claim 4, further comprising fader circuit means coupled between a source of said audio output on an input side of said fader circuit means and said positive phase input of said first differential amplifier means and said second contact of said first switch section.
6. An audio output amplifying device, comprising:
   first differential amplifier means to which an audio output is supplied at a positive phase input;
   signal selecting means for selectively outputting one of said audio output and a predetermined fixed voltage;
   second differential amplifier means to which an output of said signal selecting means is applied at a positive phase input;
   feedback means having an input terminal selectively connected to or disconnected from an output of said first differential amplifier, said input terminal being capacitively coupled to respective negative phase input terminals of said first and second differential amplifier means, so that said output of said first differential amplifier means is selectively fed back to said negative phase input terminals of said first and second differential amplifier means; and
   switching means connected between said input terminal of said feedback means and a predetermined reference potential point, said switching means being turned on and said feedback means being disconnected from said first differential amplifier output, to disable said feedback means, when an instruction is present to cause said signal selecting means to selectively output said audio output.

* * * * *